United States Patent
Tang et al.

(10) Patent No.: US 7,838,420 B2
(45) Date of Patent: Nov. 23, 2010

(54) METHOD FOR FORMING A PACKAGED SEMICONDUCTOR DEVICE

(75) Inventors: Jinbang Tang, Chandler, AZ (US); Darrel R. Frear, Phoenix, AZ (US); William H. Lytle, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 437 days.

(21) Appl. No.: 11/846,874

(22) Filed: Aug. 29, 2007

(65) Prior Publication Data

US 2009/0057849 A1 Mar. 5, 2009

(51) Int. Cl.
*H01L 21/44* (2006.01)
(52) U.S. Cl. .................... 438/672; 438/675; 257/664
(58) Field of Classification Search .......... 257/E21.502, 257/23.011, 23.174, 23.135, 23.116, 23.124, 257/664; 438/675, 672
See application file for complete search history.

(56) References Cited

U.S. PATENT DOCUMENTS

| | | | | |
|---|---|---|---|---|
| 5,949,030 A * | 9/1999 | Fasano et al. | ........... | 174/262 |
| 6,054,389 A * | 4/2000 | Cheng | ........... | 438/692 |
| 6,593,644 B2 | 7/2003 | Chiu et al. | | |
| 6,753,600 B1 | 6/2004 | Ho | | |
| 6,838,776 B2 | 1/2005 | Leal et al. | | |
| 6,921,975 B2 | 7/2005 | Leal et al. | | |
| 6,931,725 B2 * | 8/2005 | Sugaya et al. | ........... | 29/852 |
| 7,312,528 B2 * | 12/2007 | Watanabe et al. | ........... | 257/728 |
| 2002/0155692 A1 | 10/2002 | Kong | | |
| 2005/0161789 A1 | 7/2005 | Towle et al. | | |
| 2005/0167797 A1 | 8/2005 | Bong | | |
| 2006/0226415 A1 * | 10/2006 | Nishijima et al. | ........... | 257/11 |

OTHER PUBLICATIONS

International Search Report issued in corresponding PCT Application No. PCT/US2008/069516 mailed on Jan. 30, 2009.
Keser et al; "The Redistributed Chip Package: A Breakthrough for Advanced Packaging" Electronic COmponents and Technology Conference, 2007. ECTC '07. Proceedings. 57th; May 29, 2007-Jun. 1, 2007 pp. 286-291.

* cited by examiner

*Primary Examiner*—Phuc T Dang
(74) *Attorney, Agent, or Firm*—James L. Clingan, Jr.; Kim-Marie Vo

(57) ABSTRACT

A packaged semiconductor device includes an interconnect layer over a first side of a polymer layer, a semiconductor device surrounded on at least three sides by the polymer layer and coupled to the interconnect layer, a first conductive element over a second side of the polymer layer, wherein the second side is opposite the first side, and a connector block within the polymer layer. The connector block has at least one electrical path extending from a first surface of the connector block to a second surface of the connector block. The at least one electrical path electrically couples the interconnect layer to the first conductive element. A method of forming the packaged semiconductor device is also described.

13 Claims, 5 Drawing Sheets

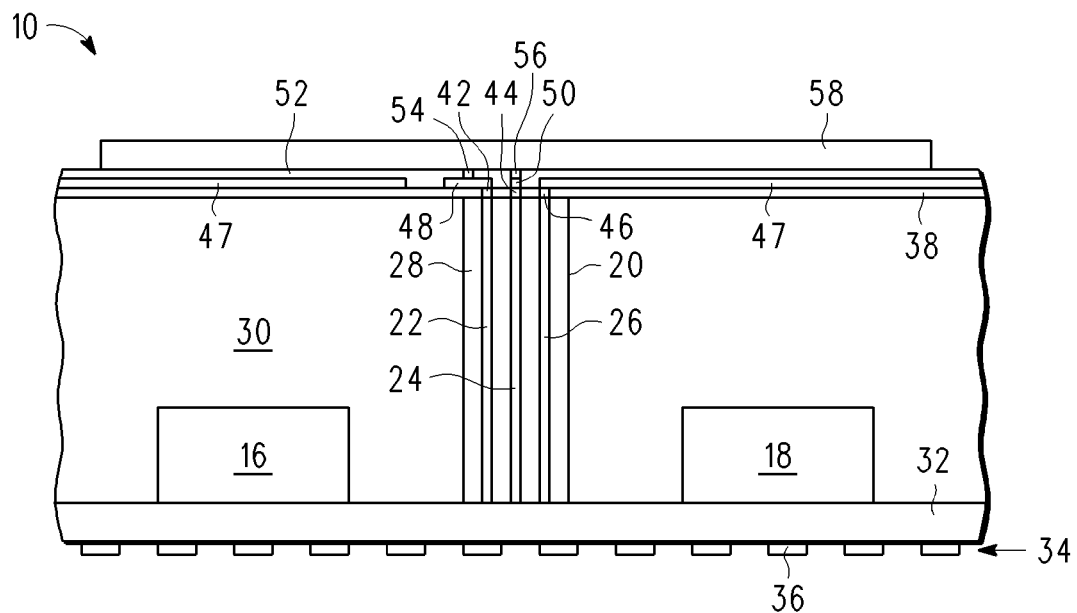
*FIG. 9*
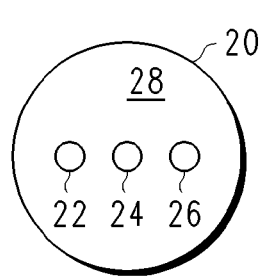
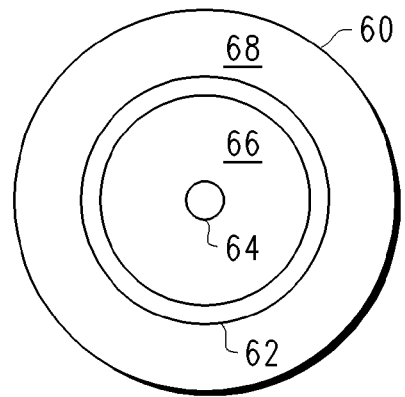
*FIG. 10*          *FIG. 11*

METHOD FOR FORMING A PACKAGED SEMICONDUCTOR DEVICE

BACKGROUND

1. Field

This disclosure relates generally to packages that have more than one element including at least one semiconductor device, and more specifically, to interconnect for such packages.

2. Related Art

One technique for increasing density of functionality is to include multiple elements, such as integrated circuits into one package. This is an alternative to simply placing all of the functionality on a single integrated circuit because there are types of integrated circuits and semiconductor components that are difficult to make on the same integrated circuit or at least difficult to optimize on the same integrated circuit. Radio frequency (RF) circuits typically require a different process than logic. Also logic and analog may need to be optimized and use a different process. One of the techniques for placing multi-elements in the same package is redistributed chip package (RCP) which uses an organic fill around the elements and builds interconnect layers on a top side of the package where external contacts are also formed. This has been found to be a useful packaging technique which provides a very effective way of combining elements and connecting to them on a top side of the package.

There is, however, further benefit for increased utility of RCP.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 9 is a cross section of the packaged semiconductor device of FIG. 8 at a subsequent stage in processing;

FIG. 10 is a top view of a portion of the packaged device of FIGS. 1-9; and

FIG. 11 is a top view of an alternative for the portion of FIG. 10.

DETAILED DESCRIPTION

An RCP is built having multiple elements that are interconnected with external connections available on a top side. One of the elements is a connection block which provides the capability of extending from the top side to a back side because the connection block is prefabricated. The connection block, which can also be called a connector block, has the organic fill formed around in the same manner as the other elements in the RCP. The connection block thus allows electrical connection to be made from the interconnect on the top side to the back side without having to etch via holes and then filling the via holes to form vias. The distance from the top side to the back side, for practical production, is too long for forming and filling vias. One application of connection block is to place an antenna on the back side. Another is place a ground plane on the back side. This is better understood by reference to the drawings and the following description.

Figure 1:
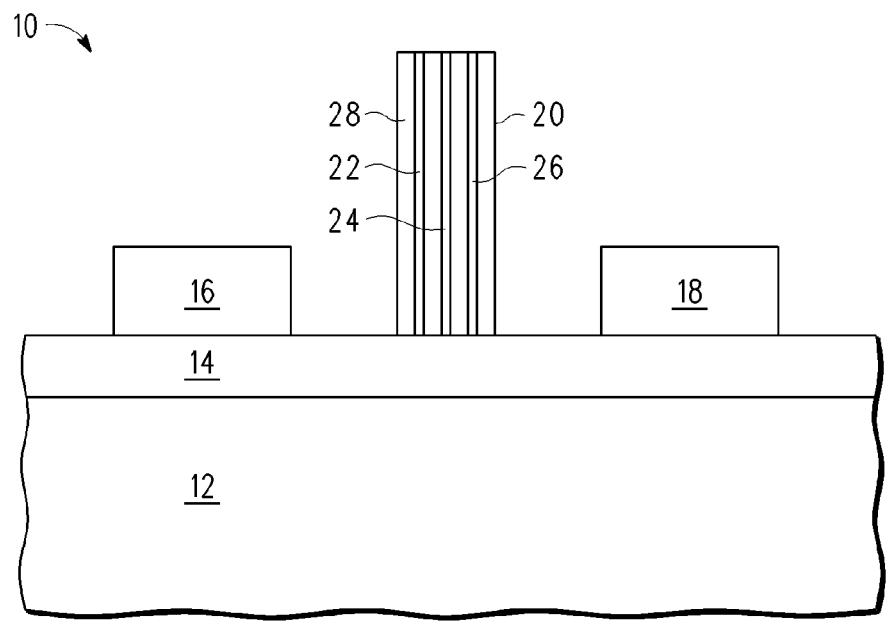
FIG. 1 is a cross section of a packaged semiconductor device at a stage in processing according to an embodiment.

Shown in FIG. 1 is a package 10 comprising a carrier 12, a tape 14, an element 16, an element 18, and connection block 20. Carrier 12 is for providing mechanical support. Tape 14 is two-sided. Element 16 may be an integrated circuit, and element 18 may be an integrated circuit. On or the other could also be another type of element such as a passive device or a discrete semiconductor device. Connection block 20 has a conductor 22, a conductor 24, and a conductor 26 that run vertically the length connection block 20 and are surrounded by a dielectric 28. Dielectric 28 is preferably an organic material similar to or the same as that used as the fill in making an RCP, but dielectric 28 could also be another material such as ceramic. Copper is a preferred material for conductors 22, 24, and 26 because of its relatively high conductivity and relatively low cost. More conductive material such as platinum, gold, or silver may be used but at a higher cost. The length of connection block 20 is chosen to be a little thicker than the thickness of the organic layer that surround the elements of the finished RCP. A common thickness for the organic layer surrounding the elements is about 0.65 millimeter (mm) but this may vary. In such case of 0.65 mm, connection block 20 and thus conductors 22, 24, and 26 are about 0.70 mm in length. Connection block 20 is preferably one mm or more in diameter. A smaller diameter may present difficulties in adhering reliably to tape 14 but may nonetheless be advantageous for some applications.

Figure 2:
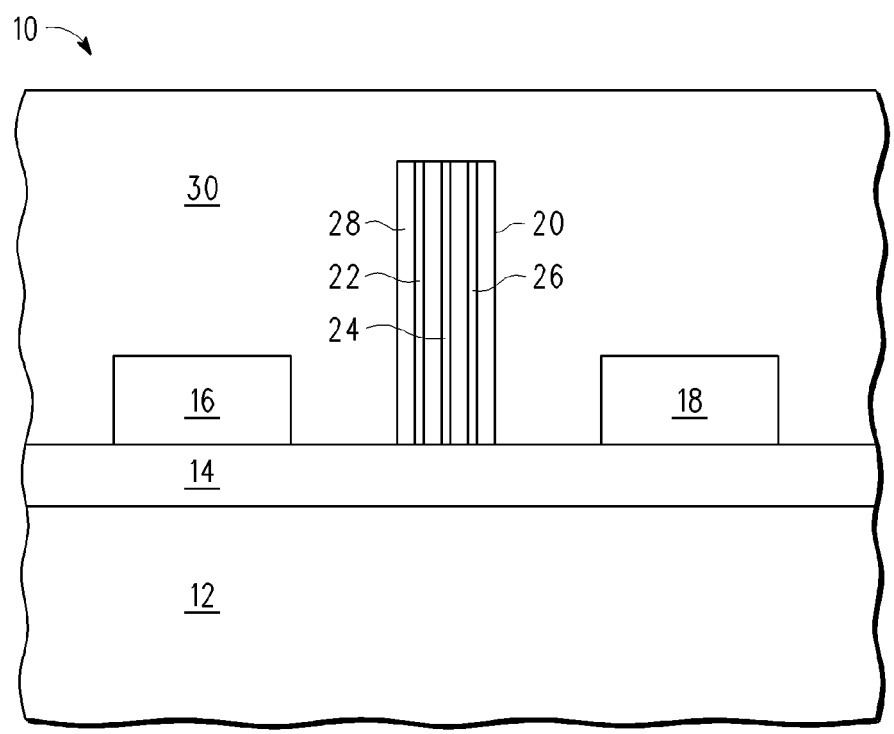
FIG. 2 is a cross section of the packaged semiconductor device of FIG. 1 at a subsequent stage in processing.

Shown in FIG. 2 is package 10 after deposition of an organic layer 30 which covers elements 16 and 18 and connection block 20. Organic layer 30 may be deposited to be about 0.80 mm for the example of connection block 20 being about 0.70 mm. Organic layer 30 may be considered a polymer layer.

Figure 3:
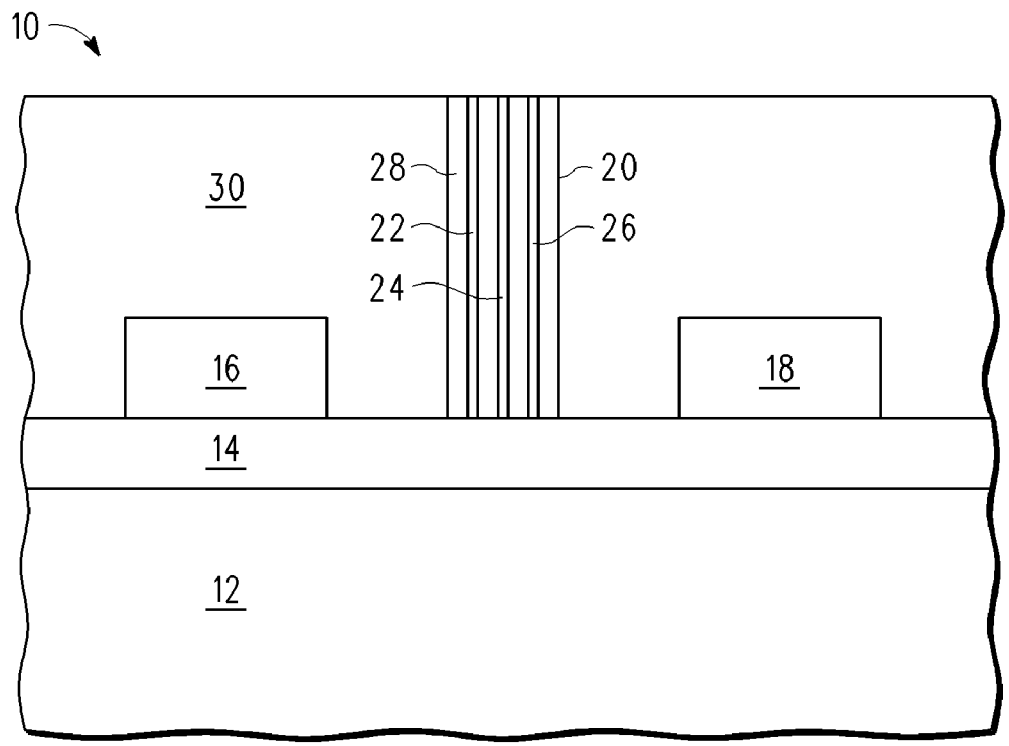
FIG. 3 is a cross section of the packaged semiconductor device of FIG. 2 at a subsequent stage in processing.

Shown in FIG. 3 is package 10 after grinding organic layer 30 and a small portion of connection block 20 to expose conductors 22, 24, and 26. Organic layer 30 is then reduced, in this example, to 0.65 mm.

Figure 4:
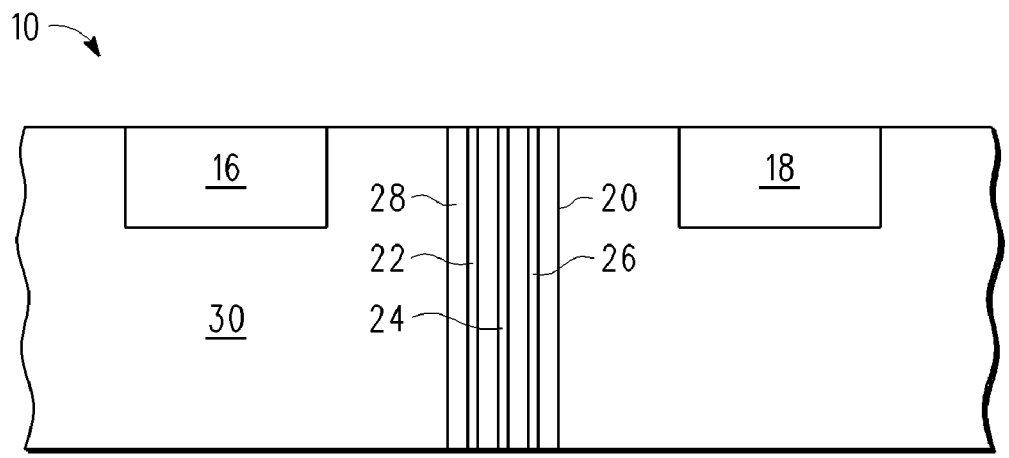
FIG. 4 is a cross section of the packaged semiconductor device of FIG. 3 at a subsequent stage in processing.

Shown in FIG. 4 is package 10 after removing carrier 12 and tape 14. FIG. 4 also has package 10 inverted from that of FIGS. 1-3. Elements 16 and 18 are exposed on the top side of package 10. The exposed surface of element 16 and the expose surface of element 18 are where contacts for elements 16 and 18 reside.

Figure 5:
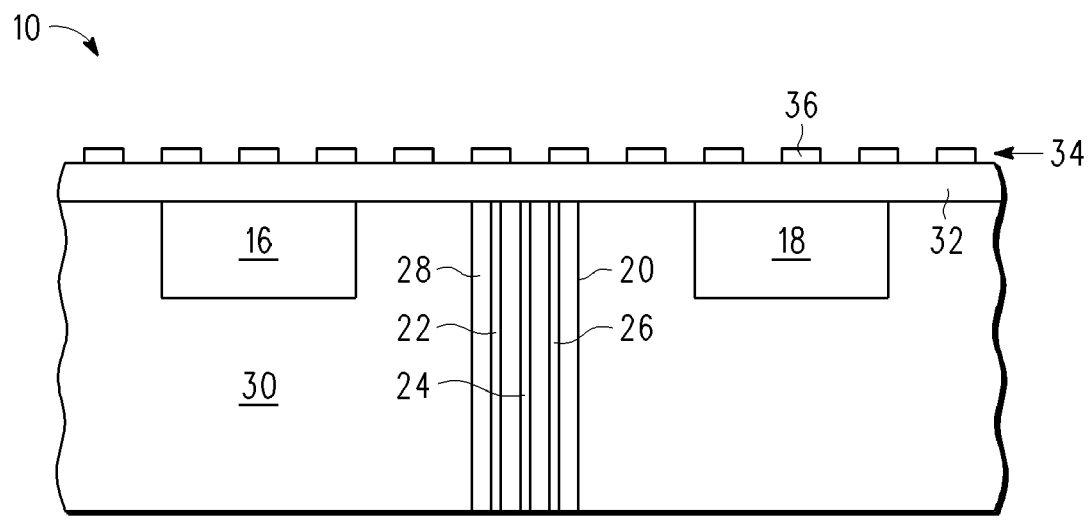
FIG. 5 is a cross section of the packaged semiconductor device of FIG. 4 at a subsequent stage in processing.

Shown in FIG. 5 is package 10 after forming an interconnect 32 in contact with connection block 20, element 16, and element 18. Interconnect 32 may be made of multiple conductive layers connected to elements 16 and 18 and connection block 20 using vias. On interconnect 32 is a plurality of pads 34 of which one is pad 36. Pads 34 are for receiving solder balls and are on a top side of package 10. Connection block 20 is exposed on a back side of package 10. In a conventional RCP which would not have connection block 20, processing could be complete except for the solder balls. Solder balls could be added at this point or at a subsequent convenient time.

Figure 6:
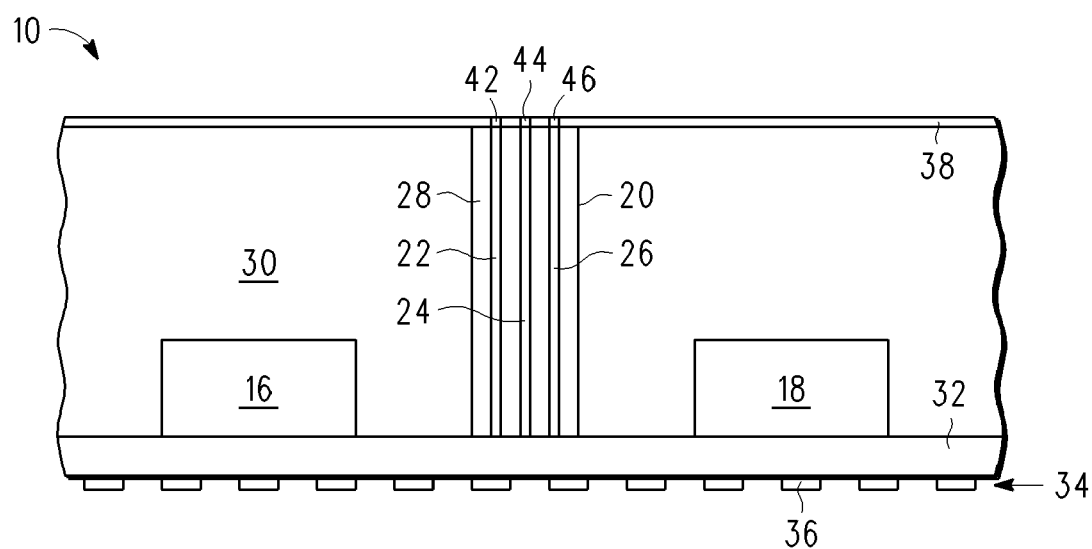
FIG. 6 is a cross section of the packaged semiconductor device of FIG. 5 at a subsequent stage in processing.

Shown in FIG. 6 is package 10 after forming a dielectric layer 38 on the back side and forming vias 42, 44, and 46 through dielectric layer 38. Dielectric layer 38 is preferably the same material as organic layer 30 but could be another insulating material. Dielectric layer 38 may be 0.1 mm thick. Via 42 is in contact with conductor 22. Via 44 is contact with conductor 24. Via 46 is in contact with conductor 46. FIG. 6 also shows package 10 inverted from FIGS. 4 and 5. The side with pads 34 is still called the top side though and the side with dielectric layer 38 is still called the back side.

Figure 7:
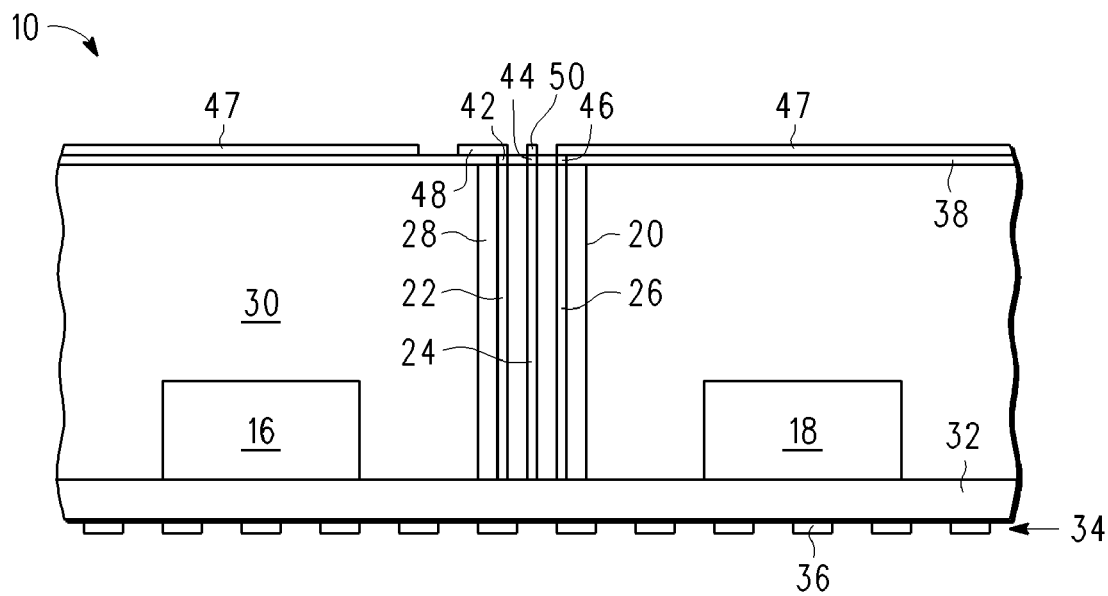
FIG. 7 is a cross section of the packaged semiconductor device of FIG. 6 at a subsequent stage in processing.

Shown in FIG. 7 is package 10 after forming a patterned conductive layer over dielectric layer 38 comprising a ground plane 47 in contact with via 40, a trace 48 on in contact with via 42, and a trace 50 in contact with via 44. Ground plane 47 surrounds traces 48 and 50. Trace 48 extends laterally from via 42 and is present for stability. Similarly, trace 50 extends laterally from via 44 in a different direction from that of trace 48 so that the lateral extension is not visible in the cross section of FIG. 7. The patterned conductive layer may be made by a conventional plating process in which a thin seed layer is deposited followed by photoresist which is patterned. Plating then ensues so that the conductive material, preferably copper although other metals may also be effective, grows in the areas not covered by the photoresist. The photoresist is removed. An etch back is performed to remove the seed layer in the areas where the conductive layer was not grown. The thickness of ground plane 47 and traces 48 and 50 may be about 0.10 mm.

Figure 8:
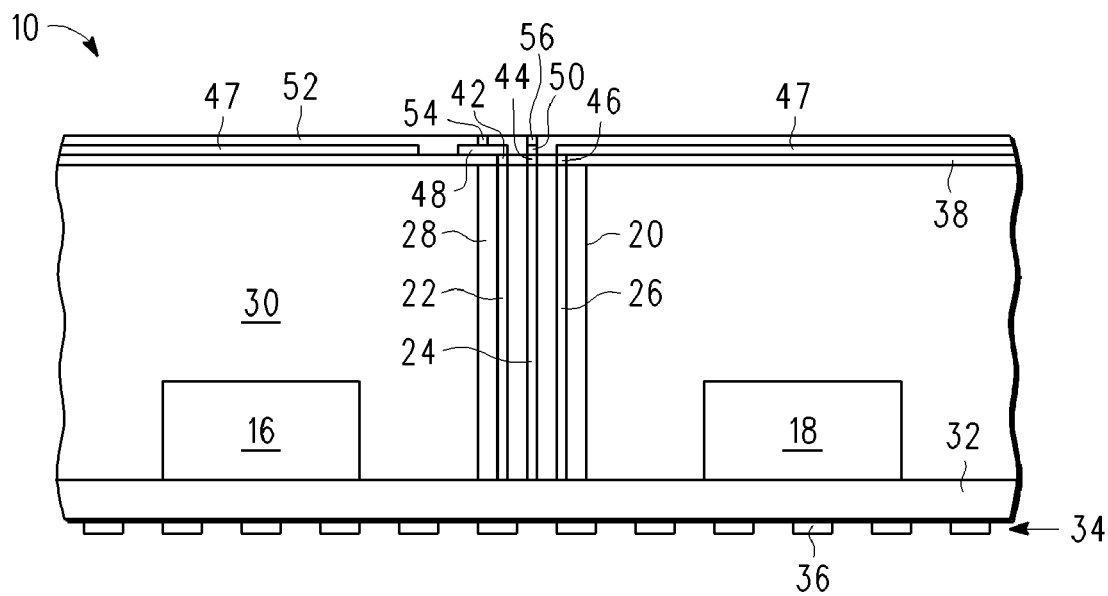
FIG. 8 is a cross section of the packaged semiconductor device of FIG. 7 at a subsequent stage in processing.

Shown in FIG. 8 is package 10 after forming a dielectric layer 52 and vias 54 and 56 through dielectric layer 52. Dielectric layer 52 may be the same material as for dielectric layer 38. Via 54 is in contact with trace 48. Via 56 is contact with trace 50. Although via 56 is shown in the cross section of FIG. 8 in contact with trace 50, via 56 is preferably located over a wider portion of trace 50 than shown.

Shown in FIG. 9 is package 10 after forming an antenna 58 in contact with vias 54 and 56. Antenna 58 may be formed and patterned using the same plating technique described for ground plane 47 and traces 48 and 50. Antenna 58 may be 0.200 mm thick. With antenna 58 in contact with vias 54 and 56, antenna is coupled to conductors 22 and 24, respectively. Due to the high frequencies that may be involved, vias 54 and 56 may not have to be in actual contact with antenna 58, if sufficiently close to antenna 58, for antenna 58 to be coupled to conductor 22. Package 10 of FIG. 9 is a completed RCP that will have solder balls added later at a time closer to being mounted on a circuit board.

Shown in FIG. 10 is a top view of connection block 20 showing conductors 22, 24, and 26 in a line and dielectric 28 surrounding them in a circular shape. In this configuration, connection block 20 is a cylinder with three inline conductors. Conductors 22, 24, and 26 could be in a different configuration. Also the shape could be different than circular, such as square, rectangular, or triangular.

Shown in FIG. 11 is an alternative connection block 60 comprising an outer insulating layer 68, a conductor ring 62, an inner conductor 64, and an insulating layer between conductor ring 62 and inner conductor 64. This forms a coaxial line which may be particularly beneficial when coupling to an antenna that is transmitting and receiving RF. Connection block 60 may replace connection block 20 with respect to the connection to antenna 58. If a ground plane were still desirable, the connection to the ground plane could be by another connection block or connection block 60 could be modified to have another conductor outside ring 62 for coupling to the ground plane.

Construction of a connection block such as connection block 20 or connection block 60 may be achieved using wire bond machines. A wire bond is commonly 25 microns in diameter. Three of those wire bonds can be placed into a cylindrical mold that is many times longer than that of connection block 20. The mold is filled with the desired dielectric such as the material used for dielectric 30. The resulting structure is then cut into pieces of the desired length of about 0.070 mm. Instead of an organic material, the surrounding dielectric may be a material such as ceramic. The rigidity of ceramic may be beneficial in the manufacturing process.

By now it should be appreciated that there has been provided a packaged semiconductor device having an interconnect layer, a semiconductor device, a first conductive element, and a connector block. The interconnect layer is over a first side of a polymer layer. The semiconductor device is surrounded on at least three sides by the polymer layer and is coupled to the interconnect layer. The first conductive element is over a second side of the polymer layer. The second side is opposite the first side. The connector block is within the polymer layer and has at least one electrical path extending from a first surface of the connector block to a second surface of the connector block, and electrically couples the interconnect layer to the first conductive element through the at least one electrical path. The connector block may comprise an insulating material surrounding the at least one electrical path. The connector block may have at least two coaxial electrical paths. The at least one electrical path may be a ground path and the first conductive element may be a ground plane. The at least one electrical path may be a signal path and the first conductive element may be an antenna. The packaged semiconductor device may further comprise a second conductive element and a second electrical path, wherein the second electrical path is a ground path and the second conductive element is a ground plane. The packaged semiconductor device may further comprise a third electrical path, wherein the third electrical path is coupled to the antenna.

Also provided is a method for forming a packaged semiconductor device. The method includes surrounding a semiconductor device on at least three sides by a polymer layer. The method further includes forming an interconnect layer over a first side of the polymer layer and over the semiconductor device, wherein the semiconductor device is coupled to the interconnect layer. The method further includes forming a conductive element over a second side of the polymer layer, wherein the second side is opposite the first side. The method further includes electrically coupling the interconnect layer to the conductive element through a connector block within the polymer layer, having at least one electrical path. The forming the conductive element over a second side may comprise plating a conductive material to form an antenna. The step of surrounding may comprise attaching a semiconductor device to a temporary support structure, forming the polymer layer over the semiconductor device, and removing the temporary support structure after forming the polymer layer. The step of electrically coupling may comprise attaching the connector block to the temporary support structure before forming the polymer layer, removing a portion of the polymer layer to expose a surface of the connector block, forming the interconnect layer over the surface of the connector block while forming the interconnect layer over the first side of the polymer layer. The method may further comprise depositing a dielectric layer over the surface of the connector block, and forming a via in the dielectric layer, wherein the via is electrically coupled to the connector block and the conductive element. The at least one electrical path may be selected from the group consisting of a ground path and a signal path. The first conductive element may be selected from a group consisting of a ground plane and an antenna. The at least one electrical path may comprise at least two coaxial electrical paths.

Further described is a method for forming a packaged semiconductor device. The method includes attaching a semiconductor device to a temporary support structure. The method further includes attaching a connector block to the temporary support structure, wherein the connector block has at least one electrical path. The method further includes forming an encapsulant over the connector block and the semiconductor device. The method further includes removing a portion of the encapsulant to expose a top surface of the connector block. The method further includes forming an interconnect layer electrically coupled to the top surface of the connector block. The method further includes removing the temporary support structure to expose a bottom surface of the connector block. The method further includes electrically coupling a tangible element to the bottom surface of the connector block. The step of electrically coupling a tangible element to the bottom surface of the connector block may comprise plating a conductive material to form an antenna. The step of electrically coupling a tangible element to the bottom surface of the connector block may further comprise depositing a dielectric layer over the bottom surface of the connector block, and forming a via in the dielectric layer, wherein the via is electrically coupled to the connector block and the antenna. The step of removing a portion of the encapsulant to expose a top surface of the connector block may comprise grinding the encapsulant. The temporary support structure may be selected from a group consisting of a tape and a carrier. The connector block may have at least two coaxial electrical paths.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, dielectric layer 38 is shown as being formed after interconnect layer 32 whereas dielectric layer 38 may be deposited before interconnect layer 32 is formed. Also plating was described as the method for forming patterned metal layers, but other deposition techniques may be used. For example, the metal could be sputtered and then patterned with an etch. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a packaged semiconductor device, the method comprising:
   surrounding a semiconductor device on at least three sides by a polymer layer and a connector block with the polymer layer;
   forming an interconnect layer over a first side of the polymer layer and over the semiconductor device, wherein the semiconductor device is coupled to the interconnect layer;
   forming a conductive element over a second side of the polymer layer, wherein the second side is opposite the first side; and
   electrically coupling the interconnect layer to the conductive element through the connector block within the polymer layer, having at least one electrical path.

2. The method of claim 1, wherein forming the conductive element over a second side comprises plating a conductive material to form an antenna.

3. The method of claim 1, wherein:
   surrounding a semiconductor device on at least three sides by the polymer layer, comprises:
      attaching a semiconductor device to a temporary support structure;
      forming the polymer layer over the semiconductor device; and
      removing the temporary support structure after forming the polymer layer; and
   electrically coupling the interconnect layer, comprises:
      attaching the connector block to the temporary support structure before forming the polymer layer;
      removing a portion of the polymer layer to expose a surface of the connector block; and
      forming the interconnect layer over the surface of the connector block while forming the interconnect layer over the first side of the polymer layer.

4. The method of claim 3, further comprising:
   depositing a dielectric layer over the surface of the connector block; and
   forming a via in the dielectric layer, wherein the via is electrically coupled to the connector block and the conductive element.

5. The method of claim 1, wherein the at least one electrical path is selected from the group consisting of a ground path and a signal path.

6. The method of claim 1, wherein the first conductive element is selected from a group consisting of a ground plane and an antenna.

7. The method of claim 1, wherein the at least one electrical path comprises at least two coaxial electrical paths.

8. A method for forming a packaged semiconductor device, the method comprising:
   attaching a semiconductor device to a temporary support structure;
   attaching a bottom surface of a connector block to a horizontal plane of the temporary support structure, wherein the connector block has at least one electrical path extending vertically from the bottom surface to a top surface of the connector block;

forming an encapsulant over and around the connector block and over the semiconductor device;

removing a portion of the encapsulant to expose a the top surface of the connector block including exposing the electrical path;

after removing the portion of the encapsulant, forming an interconnect layer on the encapsulant that is electrically coupled to the electrical path at the top surface of the connector block;

removing the temporary support structure to expose a bottom surface of the connector block; and electrically coupling a tangible element to the bottom surface of the connector block.

9. The method of claim 8, wherein electrically coupling a tangible element to the bottom surface of the connector block, comprises plating a conductive material to form an antenna.

10. The method of claim 9, wherein electrically coupling a tangible element to the bottom surface of the connector block further comprises:

depositing a dielectric layer over the bottom surface of the connector block; and forming a via in the dielectric layer, wherein the via is electrically coupled to the connector block and the antenna.

11. The method of claim 8, wherein the removing a portion of the encapsulant to expose a top surface of the connector block comprises grinding the encapsulant.

12. The method of claim 8, wherein the temporary support structure is selected from a group consisting of a tape and a carrier.

13. The method of claim 8, wherein the connector block has at least two coaxial electrical paths.

\* \* \* \* \*